United States Patent [19]

Nandakumar et al.

[11] Patent Number: 5,296,725

[45] Date of Patent: Mar. 22, 1994

[54] INTEGRATED MULTICELLED SEMICONDUCTOR SWITCHING DEVICE FOR HIGH CURRENT APPLICATIONS

[75] Inventors: Mahalingam Nandakumar; Bantval J. Baliga, both of Raleigh, N.C.

[73] Assignee: North Carolina State University at Raleigh, Raleigh, N.C.

[21] Appl. No.: 896,656

[22] Filed: Jun. 10, 1992

[51] Int. Cl.$^5$ .................... H01L 31/111; H01L 29/74
[52] U.S. Cl. .................................. 257/138; 257/139; 257/144
[58] Field of Search ............... 257/119, 139, 163, 587, 257/656, 174, 120, 122, 123, 124, 125, 126, 127, 128, 129, 130, 147, 148, 149, 150, 151, 152, 153

[56] References Cited

U.S. PATENT DOCUMENTS

| | | | |
|---|---|---|---|
| 4,646,117 | 2/1987 | Temple | 357/23.4 |
| 4,783,690 | 11/1988 | Walden et al. | 357/23.4 |
| 4,809,045 | 2/1989 | Yilmaz | 357/23.4 |
| 4,857,983 | 8/1989 | Baliga et al. | 357/38 |
| 4,931,848 | 6/1990 | Herberg | 357/23.4 |
| 4,967,255 | 10/1990 | Bauer et al. | 357/37 |
| 5,099,300 | 3/1992 | Baliga | 357/37 |

FOREIGN PATENT DOCUMENTS 1003078 3/1991 PCT Int'l Appl. ................ 257/139

OTHER PUBLICATIONS

Baliga, Adler, Gray and Love, "The Insulated Gate Rectifier (IGR): A New Power Switching Device," IEEE-82, pp. 264-267, 1982.

Temple, "MOS Controlled Thyristors (MCT'S)", IEDM-84, pp. 282-285, 1984.

Baliga, Adler, Love, Gray and Zommer, "The Insulated Gate Transistor: A New Three-Terminal MOS-Controlled Bipolar Power Device, IEEE Transactions on Electron Devices", vol. ED-31, No. 6, pp. 821-828, Jun., 1984.

Baliga and Chang, "The MOS Depletion-Mode Thyristor: A New MOS-Controlled Bipolar Power Device", IEEE Electron Device Letters, vol. 8, No. 8, pp. 411-413, Aug. 1988.

Baliga, "The MOS-Gated Emitter Switched Thyristor", IEEE Electron Device Letters (reprint), vol. 11, No. 2, pp. 75-77, Feb. 1990.

Nandakumar, Baliga, Shekar, Tandon and Reisman, "A New MOS-Gated Power Thyristor Structure with Turn-Off Achieved by Controlling the Base Resistance," IEEE Electron Letters, vol. 12, No. 5, pp. 227-229, May, 1991.

Shekar, Baliga, Nandakumar, Tandon and Reisman, "Characteristics of the Emitter-Switched Thyristor", IEEE Transactions on Electron Devices, vol. 38, No. 7, pp. 1619-1623, Jul. 1991.

Nandakumar, Baliga, Shekar, Tandon and Reisman, "The Base Resistance Controlled Thyristor (BRT) 'A New MOS Gated Power Thyristor'", IEEE, pp. 138-141, 1991.

Shekar, Baliga, Nandakumar, Tandon and Reisman, "Experimental Demonstration of the Emitter Switched Thyristor", pp. 128-131.

*Primary Examiner*—William L. Sikes
*Assistant Examiner*—Fetsum Abraham
*Attorney, Agent, or Firm*—Bell, Seltzer, Park & Gibson

[57] ABSTRACT

An integrated multicelled thyristor includes a plurality of main thyristor cells and a plurality of edge thyristor cells. The main thyristor cells comprise source cells located in the center or innermost portion of an integrated thyristor and the edge cells are located at the periphery. In order to insure that all thyristor cells turn off uniformly, current exporting means is provided from the source cells to the edge cells to reduce current hole crowding in the peripheral cells. The anodes of all cells are electrically connected and the cathodes of all main cells are electrically connected. However, the cathodes of the edge cells are electrically connected to one or more source cells by the current exporting means. The unit cell of the multicelled device preferably comprises a BRT, but can comprise other well known thyristor structures where turn-off is limited by hole-current crowding.

30 Claims, 7 Drawing Sheets

FIG. 1.
BASE RESISTANCE THYRISTOR
(PRIOR ART)

FIG. 6A.
(EMITTER LENGTH DIRECTION)

FIG. 6B.
(EMITTER WIDTH DIRECTION)

FIG. 7A.
(EMITTER LENGTH DIRECTION)

FIG. 7B.
(EMITTER WIDTH DIRECTION)

FIG. 8A.
(EMITTER LENGTH DIRECTION)

FIG. 8B.
(EMITTER WIDTH DIRECTION)

INTEGRATED MULTICELLED SEMICONDUCTOR SWITCHING DEVICE FOR HIGH CURRENT APPLICATIONS

FIELD OF THE INVENTION

The present invention relates to semiconductor switching devices, and more particularly to an integrated semiconductor device comprising a plurality of parallel connected switching cells.

BACKGROUND OF THE INVENTION

The development of semiconductor switching technology for high power applications in motor drive circuits, appliance controls and lighting ballasts, for example, began with the bipolar junction transistor. As the technology matured, bipolar devices became capable of handling very large current densities in the range of 200–300 A/cm$^2$, with blocking voltages of 600 V.

Despite the attractive power ratings achieved by bipolar transistors, there exist several fundamental drawbacks to the suitability of bipolar transistors for all high power applications. First of all, bipolar transistors are current controlled devices. Accordingly, a large control current into the base, typically one fifth to one tenth of the collector current, is required to maintain the device in an operating mode. Even larger base currents, however, are required for high speed forced turn-off. These characteristics make the base drive circuitry complex and expensive. The bipolar transistor is also vulnerable to breakdown if a high current and high voltage are simultaneously applied to the device, as commonly required in inductive power circuit applications, for example. Furthermore, it is difficult to parallel connect these devices since current diversion to a single device occurs at high temperatures, making emitter ballasting schemes necessary.

The power MOSFET was developed to address this base drive problem. In a power MOSFET, a bias voltage for turn-on and turn-off control is applied to a gate electrode. The gate electrode is separated from the device's active area by an intervening insulator, typically silicon dioxide. Because the gate is insulated from the active area, little if any gate current is required in either the on-state or off-state. The gate current is also kept small during switching because the gate forms a capacitor with the device's active area. Thus, only charging and discharging current ("displacement current") is required. The high input impedance of the gate, caused by the insulator, is a primary feature of the power MOSFET. Moreover, because of the minimal current demands on the gate, the gate drive circuitry and devices can be easily implemented on a single chip. As compared to bipolar technology, the simple gate control provides for a large reduction in cost and a significant improvement in reliability.

These benefits are offset, however, by the high on-resistance of the MOSFET's active region, which arises from the absence of minority carrier injection. Indeed, the drift region of the power MOSFET represents a high series resistance during current conduction. As a result, the device's operating forward current density is limited to relatively low values, typically in the range of 10 A/cm$^2$, for a 600 V device, as compared to 200–300 A/cm$^2$ for the bipolar transistor.

On the basis of these features of power bipolar transistors and MOSFET devices, it is apparent that hybrid devices embodying a combination of bipolar current conduction with MOS-controlled current flow would provide significant advantages over single technologies such as bipolar or MOSFET alone. Thus, in the Insulated Gate Bipolar Transistor (IGBT), disclosed in an article by coinventor B. J. Baliga, M. S. Adler, R. P. Love, P. V. Gray and N. Zommer, entitled "The Insulated Gate Transistor: A New Three Terminal MOS Controlled Bipolar Power Device," IEEE Trans. Electron Devices, ED-31, pp. 821–828 (1984), on-state losses were shown to be greatly reduced when compared to power MOSFETs. This was caused by the conductivity modulation of the IGBT's drift region during the on-state.

Although gate-controlled bipolar transistors, such as the IGBT, represent an improvement over using bipolar or MOSFET devices alone, even lower conduction losses can be expected by using a thyristor. This is because thyristors offer a higher degree of conductivity modulation and a lower forward voltage drop when turned on. Consequently, the investigation of thyristors is of great interest so long as adequate methods for providing forced gate turn-off can also be developed. As will be understood by one skilled in the art, a thyristor in its simplest form comprises a four-layer P1-N1-P2-N2 device with three P-N junctions in series: J1, J2, and J3, respectively. The four layers correspond to the anode (P1), the first base region (N1), the second base or P-base region (P2) and the cathode (N2), respectively. In the forward blocking state, the anode is biased positive with respect to the cathode and junctions J1 and J3 are forward biased and J2 is reversed-biased. Most of the forward voltage drop occurs across the central junction J2. In the forward conducting state, all three junctions are forward biased and the voltage drop across the device is very low and approximately equal to the voltage drop across a single forward biased P-N junction.

An inherent limitation to the use of thyristors for high current applications is sustained latch-up, however, arising from the coupled P1-N1-P2 and N1-P2-N2 bipolar transistors which make up the four layers of the thyristor. This is because sustained thyristor latch-up can result in catastrophic device failure if the latched-up current is not otherwise sufficiently controlled by external circuitry or by reversing the anode potential. Sustained latch-up can occur, for example, when the summation of the current gains for the thyristor's regeneratively coupled P1-N1-P2 and wide base P1-N2-P2 transistors exceeds unity. An alternative to providing external circuitry or reversing the anode potential to obtain turn-off, however, is to use a MOS-gate for controlling turn-on and turn-off.

Several methods for obtaining MOS-gate control over thyristor action, including the parasitic latch-up mechanism, exist. For example, in the MOS-controlled thyristor (MCT), turn-off is provided by shorting the emitter-base junction of the N-P-N transistor to thereby produce a reduction in gain. This raises the holding current of the thyristor to above the operating current. Accordingly, an MCT structure has been reported which utilizes an P-channel MOSFET integrated into the P-base region of a thyristor with a N$^-$ drift region. This device is described in an article by V. A. K. Temple, entitled "The MOS Controlled Thyristor," published in IEDM Technology Digest, Abstract 10.7, pp. 282–285, (1984). However, the maximum controllable current density, which is a direct measure of a device's ability to turn-off, is limited by the MOSFET inversion-layer channel resistance and other resistances in the base region. Because of the lower mobility for holes in silicon, MCT's built from N-type high-voltage drift layers exhibit poor current turn-off characteristics.

Other examples of MOS-gated thyristors include the depletion-mode thyristor (DMT), which overcame many of the drawbacks associated with the MCT. In the DMT, a depletion mode MOSFET is placed in series with the base of the P-N-P transistor. Accordingly, once the thyristor is turned-on, current flow can be shut off by application of a negative gate bias. This eliminates the base drive by pinching off the base current to the P-N-P transistor and shuts off the device. Both the MCT and DMT exhibit low forward drop and high on-state current densities.

In another device, described in an article entitled "The MOS-Gated Emitter Switched Thyristor," by coinventor Baliga, published in IEEE Electron Device Letters, Vol. 11, No. 2, pp. 75-77, February, 1990, turn-on is achieved by forcing the thyristor current to flow through an N-channel MOSFET and floating emitter integrated within the P-base region. This article is hereby incorporated herein by reference. As will be understood by one skilled in the art, the length of the floating N+ emitter region controls the holding and triggering current for the device. Turn-off of the emitter switched device (EST) is accomplished by reducing the gate voltage on the MOSFET to below the threshold voltage. This cuts off the floating N+ region from the cathode and shuts-off the device.

Unfortunately, the integration of a MOSFET in the P-base region causes a parasitic thyristor to be formed. If this thyristor turns-on, the EST can no longer be turned off by reducing the MOSFET gate voltage to zero. Turn-on of the parasitic thyristor is initiated by the onset of electron injection from the N+ emitter of the parasitic thyristor when forward biased, and is dictated by the resistance of the P-base under the N+ emitter region. Accordingly, the likelihood that parasitic latch-up will occur can be reduced if the P-base resistance is lowered by making the length of the N+ emitter region small and by using a P+ diffusion to reduce the sheet resistance of the P-base.

Figure 1:
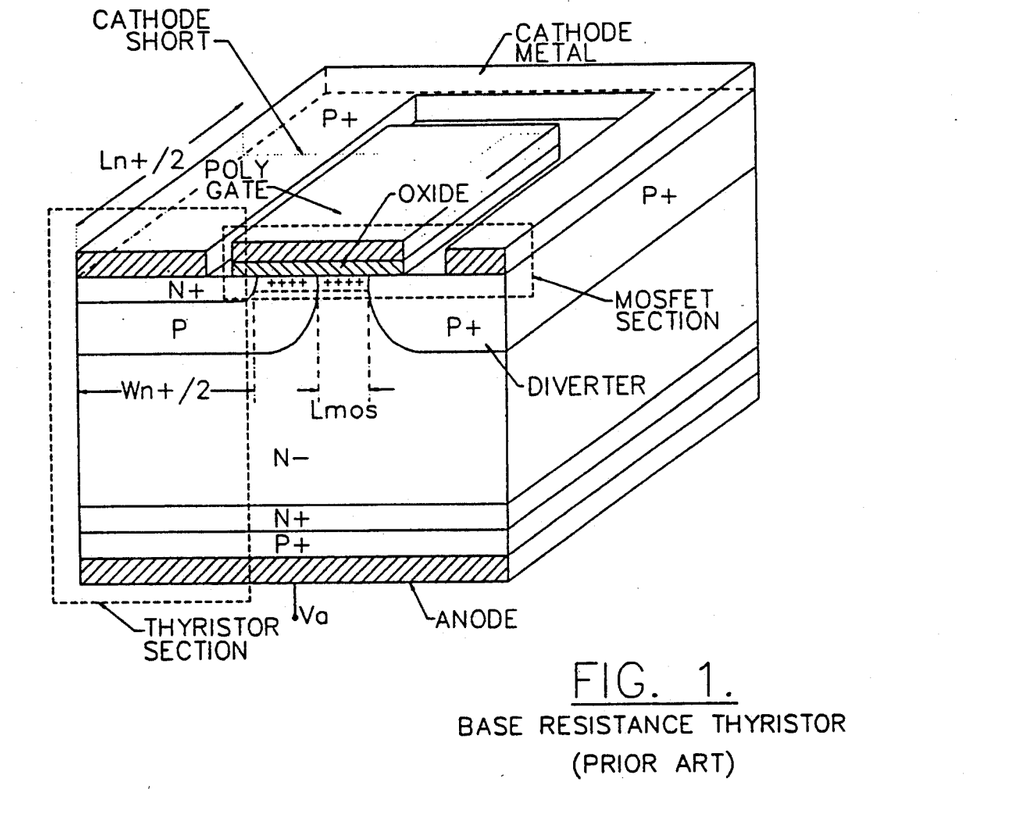
FIG. 1 illustrates a cross-sectional representation of a conventional base resistance controlled thyristor (BRT) unit cell.

More recently, a base resistance controlled thyristor (BRT) was described in U.S. Pat. No. 5,099,300, to Baliga, and an article entitled "A New MOS-Gated Power Thyristor Structure with Turn-Off Achieved by Controlling the Base Resistance," by coinventors M. Nandakumar and B. J. Baliga, and M. Shekar, S. Tandon, and A. Reisman, IEEE Electron Device Letters, Vol. 12, No. 5, pp. 227-229, (1991), both of which are hereby incorporated herein by reference. The principle of operation involves modulation of the lateral P-base resistance of the thyristor using MOS gate control. Operational BRTs with 600-volt forward blocking capability, such as the one shown in FIG. 1 in three dimensions, have been developed. FIG. 1 is a reproduction of FIG. 1 from the aforesaid Nandakumar, et al. article. The BRT can be turned-off by application of a negative bias to a diverting means to thereby reduce the resistance of the P-base by providing a parallel path for current flow to the cathode. The reduction in P-base resistance results in an increase in the device's holding current to above the operational current level and shuts-off the device.

It will be understood by one skilled in the art that for high current applications, multiple discrete thyristors can be connected in parallel and operated with single MOS-gate control. Moreover, in place of using discrete thyristors, multiple thyristor cells can be integrated by replicating unit thyristor cells across a semiconductor substrate. Accordingly, the current carrying capability of an integrated thyristor can be scaled upward in proportion to the number of cells on a semiconductor substrate.

Because it is expected that each of the thyristor cells performs identically regardless of their location on the semiconductor substrate, the maximum controllable current density should be the same for each cell. This value is of considerable importance since it provides the maximum turn-off current density for a cell. However, experimental results by the inventors have confirmed that as the multicelled thyristor is scaled upwards, the maximum controllable current does not scale proportionately as expected. Accordingly, it would be advantageous to provide an integrated multicelled switching device capable of being proportionally scaled to higher currents without a decrease in the maximum controllable current density per unit cell.

SUMMARY OF THE INVENTION

It is therefore an object of the present invention to provide an integrated multicelled semiconductor switching device, with high maximum controllable current density.

It is another object of the present invention to provide an upwardly scaleable semiconductor switching device with scaleable maximum controllable current density.

These and other objects are provided, according to the present invention, by an integrated multicelled thyristor switching device having a plurality of parallel connected main thyristor cells in an interior portion of a semiconductor substrate, and a plurality of edge cells in an exterior portion of the same substrate. Current exporting means provides a portion of the current from at least some of the main cells to the edge cells.

Although not wishing to be bound by any theory of operation, it was determined by the inventors that the reduction in average controllable current density for a multicelled structure was caused by hole current crowding in the P-base region of the edge cells. Consequently, the edge cells could not be turned off because the maximum controllable current density for these cells was substantially below the rated value for the main cells located in the interior portion of the substrate. As will be understood by one skilled in the art, the maximum controllable current density is inversely proportional to the hole current entering the P-base.

According to the invention, by providing electron current from the main cells to the edge cells, by a controlled current exporting means, a reduction in parasitic hole current crowding in the cells near the periphery is achieved. Moreover, since the electron current flow to the edge cells can be controlled by main cells in the interior portion of the substrate, turn-off of the multicelled structure is no longer edge limited. Accordingly, the average maximum controllable current density of the cells can be maintained at or near the rated value for the particular cell structure and the total maximum controllable current for the integrated device can be scaled upwards in proportion to the number of cells.

As will be understood by one skilled in the art, a typical integrated multicelled thyristor can have upwards of tens of thousands of cells. According to a preferred embodiment of the invention, the innermost main cells, referred to as "core" cells, need not be modified. An intermediate group of main cells, referred to as "source cells", however, is modified to export a portion of their current to the outermost cells. The outermost or "edge" cells are also modified to accept the exported current from the source cells, to thereby reduce hole-current crowding effects in the second base regions (P-base) of the cells near the periphery. In addition, because the edge cells derive their current from the source cells which can be easily turned off, the turn-off of the edge cells is not edge limited.

According to one embodiment of the present invention, an integrated multicelled thyristor switching device is provided having a plurality of main cells and edge cells formed in a semiconductor substrate comprising an anode layer and a first base layer formed thereon. Electrical contact is made to the anode layer by an anode metallization layer. A plurality of main cells are formed in the interior portion of the substrate in the first base region. The main cells preferably comprise core cells and source cells but may also comprise source cells alone. If core cells are present, they typically comprise the innermost cells of the integrated switching device. The core cells further comprise a second base region (P-base) formed in the first base region. The cathode to the core cells comprises a cathode contact and an N+ emitter region formed in the second base region. Accordingly, the anode layer, first base layer, second base region and emitter region comprise a P1-N1-P2-N2 core thyristor cell. In the preferred embodiment, the core cells comprise unit BRT cells.

The source cells are preferably similar in structure to the core cells, however, a current exporting means is integrated within the second base region of the source cells. For a multicelled switching device comprising BRT cells, the current exporting means preferably comprises a collector in the second base region of the source cell. The current exporting means transfers current from one or more source cells to one or more edge cells. Moreover, unlike the cathodes for the main cells which are electrically interconnected in parallel, the cathodes for the edge cells are connected to the current exporting means by a plurality of floating metal straps.

As will be understood by one skilled in the art, the exporting of current from source cells to edge cells reduces hole-current crowding effects in the cells at the periphery and improves the turn-off characteristics of the edge cells. The current exporting means for each source cell may also be electrically connected in parallel to one or more edge cells. Finally, it will be understood that the current exporting concept of the present invention can be applied to any multicelled power device in which hole current crowding takes place in the peripheral cells thereof. Moreover, the current exporting concept can be extended to complimentary device structures wherein electron current crowding takes place in the peripheral cells.

DESCRIPTION OF A PREFERRED EMBODIMENT

The present invention will now be described more fully hereinafter with reference to the accompanying drawings, in which a preferred embodiment of the invention is shown. This invention may, however, be embodied in many different forms and should not be construed as limited to the embodiment set forth herein; rather, this embodiment is provided so that this disclosure will be thorough and complete, and will fully convey the scope of the invention to those skilled in the art. Like numbers refer to like elements throughout.

Figure 2:
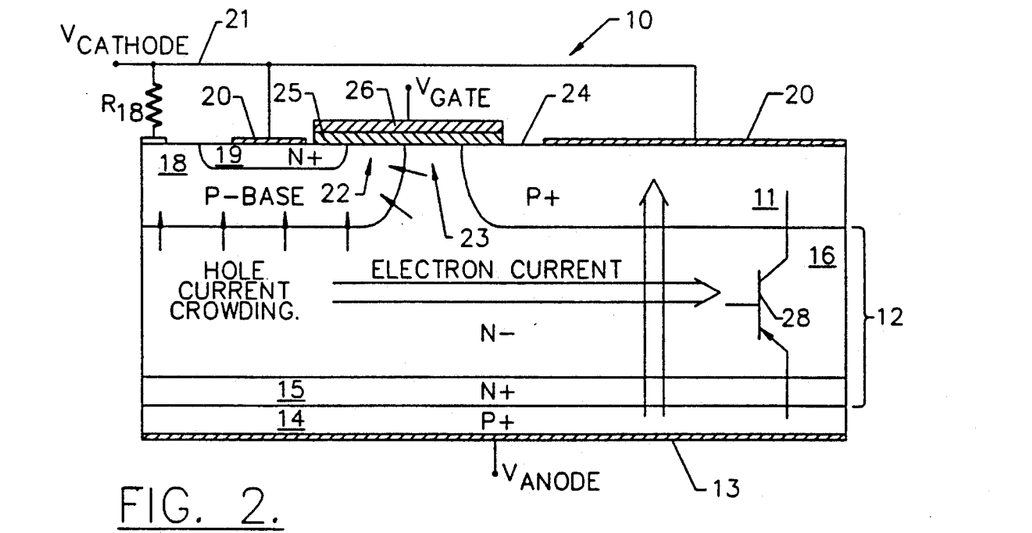
FIG. 2 illustrates a cross-sectional representation of an edge cell of a conventional BRT with hole current crowding effects shown symbolically.

Referring now to FIG. 2, a two-dimensional cross-sectional representation of a conventional edge cell from a multicelled thyristor switching device is shown. The edge cell 10 comprises a conventional BRT having a P+ diverter region 11 defined in the first base region 12 at the exterior portion of a semiconductor substrate. As will be understood by one skilled in the art, the diverter region 11 of a conventional BRT provides a low resistance path to the cathode during turn-off. As determined by the inventors, the maximum controllable current density rating for the edge cell was substantially below that for the main cells on the same substrate because of hole current crowding effects. Accordingly, the edge cells turned off at a lower current density and degraded the operation of the multicelled device.

The edge cell of FIG. 2 further comprises: an anode contact 13; a P+ anode layer 14; an N+ layer 15 and N− drift layer 16 comprising the first base region 12; a P-base or second base region 18; and an N+ emitter region 19 and cathode contact 20 comprising the cathode 21. A gating means comprising a first field effect transistor 22 and a diverting means comprising a second field effect transistor 23 for turn-on and turn-off control, respectively, are formed at the surface 24 beneath oxide layer 25. Turn-on and turn-off control are provided by a common gate electrode 26. The diverter region 11 is also connected to the cathode contact 20. The element $R_{18}$ is the equivalent resistance of the P-base region 18 under the N+ emitter region 19 in the emitter length direction, as shown more fully in FIG. 1 on the left hand side.

As will be understood by one skilled in the art, if the anode contact 13 is biased positive with respect to the cathode 21, the edge cell 10 can be turned on by the application of a positive gate bias to the gate electrode 26. This results in the formation of an N-type inversion layer at surface 24 beneath oxide layer 25, and the turn-on of first field effect transistor 22. Once the inversion layer has been established, electrons flow from the emitter region 19 into the N− drift region 16 via the N-type inversion layer. These electrons provide the base current drive for the wide base vertical P1-N1-P2 transistor, comprising regions 14, 12 and 18. Because of the regeneratively coupled nature of the vertical P1-N1-P2 transistor and vertical N1-P2-N2 transistor comprising regions 16, 18 and 19, latch-up occurs once the summation of the gains of the coupled transistors exceeds unity. Once latch-up occurs, a current is set up between the anode contact 13 and the cathode 21.

For a BRT unit cell, turn-off is controlled by the application of a negative bias to gate electrode 26. This eliminates the N-type inversion layer and creates a P-type channel in the second field effect transistor 23 at surface 24. The diverter region 11 acts as the source of transistor 23 and provides a low-resistance path to the cathode contact 20 for the holes in the P-base region 18. Accordingly, holes in the P-base region 18 will be diverted or shunted to the cathode electrode without having to flow through $R_{18}$ to the cathode contact 20. This has the effect of raising the holding current to above 1000 A/cm$^2$ to thereby turn-off the edge cell 10.

However, for the BRT edge cell of FIG. 2, it was determined that secondary hole current through the large area vertical P-N-P transistor 28 could be substantial during the on-state. Moreover, because the entire base drive for the thyristor action and transistor 28 comes in the form of electron current supplied by the small N+ emitter region 19, the electron current density in the edge cell emitter region 19 is much higher than that for the main thyristor cells in the interior portion of the semiconductor substrate. As will be understood by one skilled in the art, the higher emitter current density results in a proportionately greater base current in the P-base region and a lower maximum controllable current density rating. This is because the density of the base current and the maximum controllable current density are inversely related.

Figure 3:
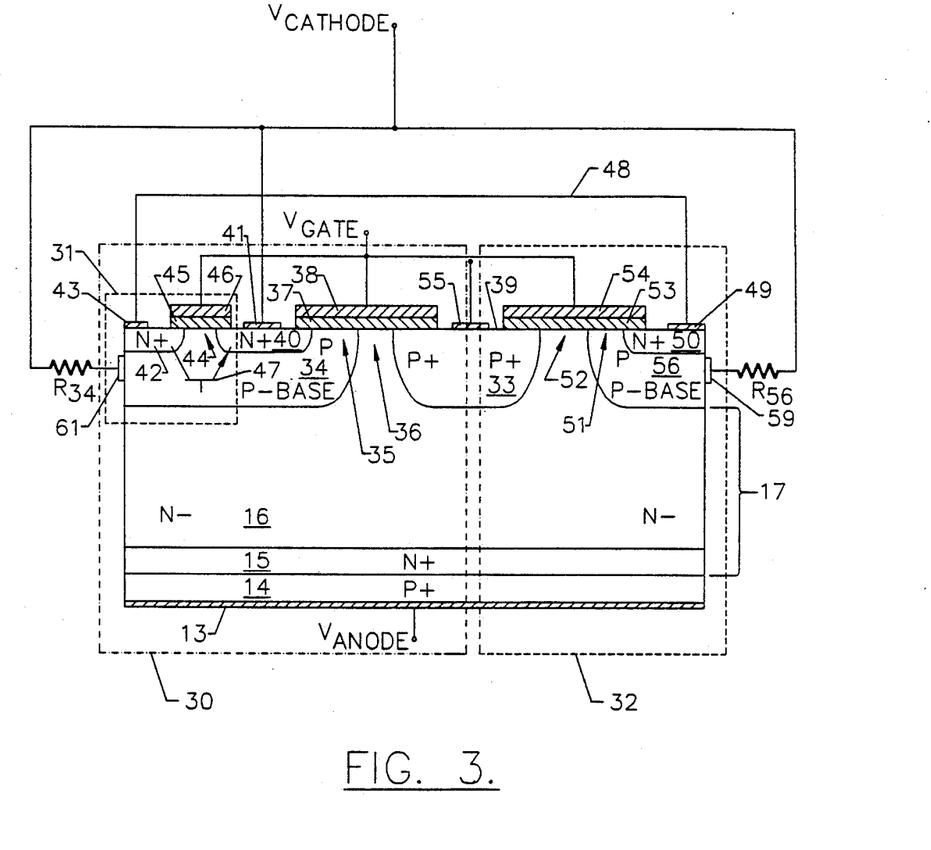
FIG. 3 illustrates a cross-sectional representation of a source cell adjacent an edge cell, according to one embodiment of the present invention.

Referring now to FIG. 3, a source cell 30 having current exporting means 31, and an edge cell 32 are provided according to the present invention in order to improve the turn-off characteristics of integrated switching device by raising the maximum controllable current density for the peripheral cells, including edge cells. Unlike the conventional edge cell structure of FIG. 2, the edge cell 32 of FIG. 3 shares a diverter region 33 with an adjacent main cell, shown as source cell 30. The cells share a common anode contact 13, anode layer 14 and first base region 17, in the preferred embodiment. A P-base or second base region 34 is defined in the source cell 30 and includes a portion of the current exporting means 31. The base resistances $R_{34}$ and $R_{56}$, connected to the second base regions 34 and 56, respectively, are shown schematically to illustrate that in three dimensions, the base current flows beneath the N+ emitter regions 40 and 50 to the contacts 61 and 59, respectively.

The gating means for the source cell 30 comprises a first field effect transistor 35 between the N− drift region 16 and the N+ emitter region 40. The diverting means for the source cell 30 comprises a second field effect transistor 36 between the diverter region 33 and the second base region 34. The gating means and diverting means provide turn-on and turn-off control, respectively, as described for the BRT unit cell of FIG. 2. The first and second field effect transistors preferably comprise an insulating or oxide layer 37 and a gate electrode 38 on the semiconductor surface 39. In the preferred embodiment, the gate electrodes for all parallel connected cells and edge cells are electrically connected.

The source cell comprises an emitter region 40 and a cathode contact 41. Unique to the source cell, however, is the collector region 42, the collector contact 43, and the third field effect transistor 44 having an insulating layer 45 on surface 39 and a gate electrode 46. When a positive bias is applied to gate electrode 46, an N-channel is created at surface 39 beneath layer 45. This channel forms a low resistance path which electrically connects the emitter 40 to the collector region 42. A lateral N-P-N bipolar transistor 47 having a collector defined by collector region 42 is also created.

As will be understood by one skilled in the art, the bipolar transistor 47 and third field effect transistor 44 provide a parallel connected means for exporting electron current from the emitter region 40 to the edge cell emitter contact 49 along the floating metal strap 48. In the preferred embodiment, a plurality of source cells are connected in parallel with respect to one or more edge cells. According to this aspect of the present invention, the current in any one edge cell emitter region 50 would comprise currents from a plurality of source cells. The use of a plurality of source cells insures that the voltage drop across the parallel combination of the third field effect transistor 44 and lateral N-P-N transistor 47 is kept small by reducing the current demand on each individual source cell.

Referring now to the edge cell shown in FIG. 3, a fourth and fifth field effect transistor 51 and 52, respectively, having an insulating layer 53 and gate electrode 54, are provided for turn-on and turn-off control of the edge cell. The common diverter region 33 is connected to the cathode by contact 55, and provides a low resistance path for removing holes from the first base region during turn-off. Because the current provided to the edge cell emitters is controlled by a plurality of parallel connected source cells, the edge cells can be readily shut off by turning off the source cells and disabling the current exporting means.

As will be understood by one skilled in the art, alternative embodiments for the multicelled structure described above can be configured. For example, the core cells of the multicelled structure could be eliminated altogether or placed in between the source and edge cells. Alternatively, the core, source and edge cells could comprise different unit cell configurations, although in the preferred embodiment they are the same.

Figure 4:
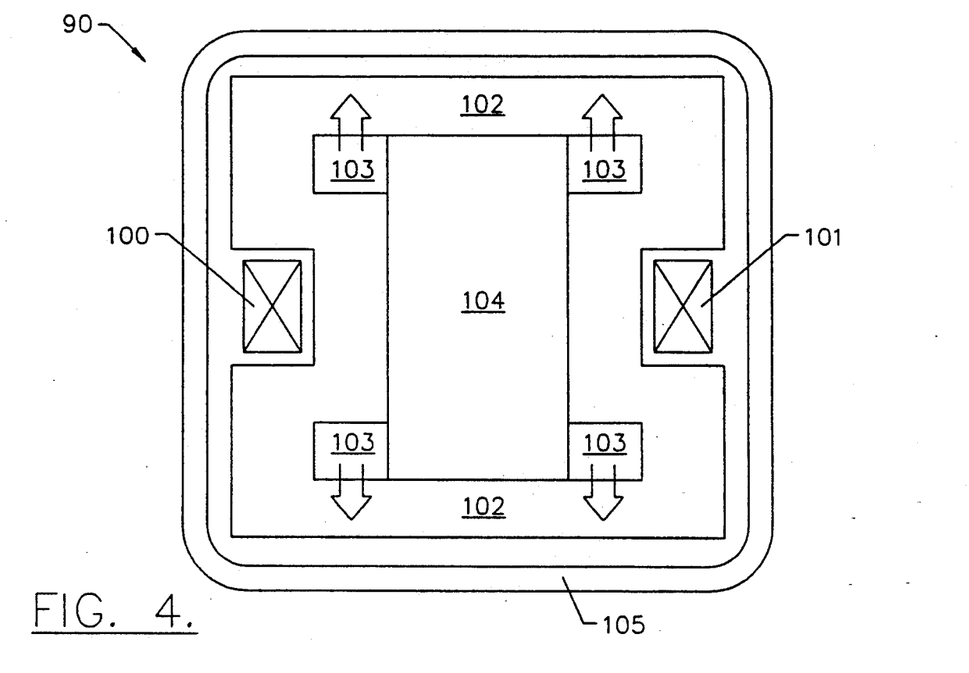
FIG. 4 illustrates a symbolic layout of an integrated multicelled thyristor switching device, including core cells, source cells and edge cells, according to the present invention.

Referring now to FIG. 4, a symbolic layout of an integrated multicelled semiconductor switching device 90 is shown. Electrical contact to the integrated device 90 is made by a cathode contact pad 100, a gate contact pad 101 and the anode contact, not shown, on the reverse side. The integrated device 90 typically includes a large number of individual cells which are electrically connected in parallel to form a high current switching device. According to the invention, although all cells contribute to the current provided by the integrated device 90, the source cells 103 and edge cells 102 are designed differently to reduce hole-current crowding at the periphery of the integrated device 90 and improve the device's turn-off characteristics. According to present invention, the source cells 103 export a portion of their current to the edge cells 102, shown symbolically by the arrows in FIG. 4.

The edge cells 102 are provided around the periphery of the integrated device 90 and the source cells 103 are located in the interior, preferably adjacent the edge cells 102. The device 90 may also include core cells 104, as shown, although it will be understood that the entire interior portion of the device may be comprised of source cells 103 alone. The core cells 104 are conventional cells because they do not export current to any other cells. A field ring 105 is also provided for electrical isolation.

Figure 5:
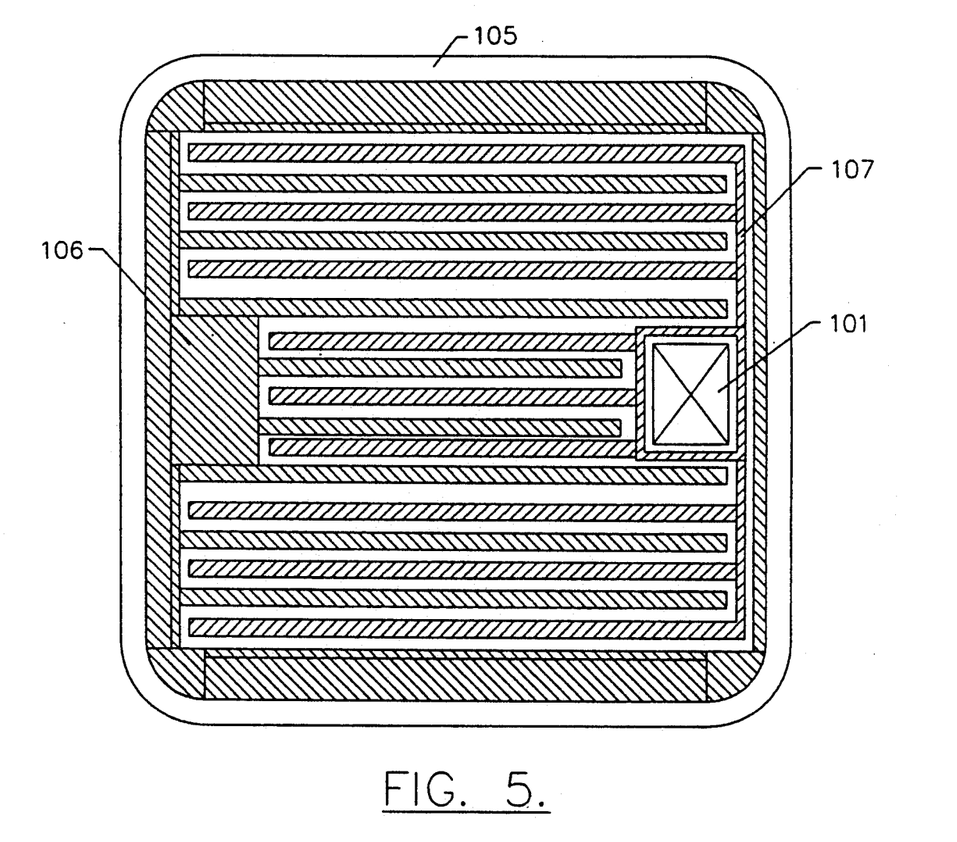
FIG. 5 illustrates a symbolic layout of the top level of metallization according to the integrated multicelled thyristor of FIG. 4.

Referring now to FIG. 5, a symbolic layout of the metallization for the switching device of FIG. 2 is shown. The cathode contact metal 106 makes electrical contact with the external cathode contact pad 100, not shown, and comprises metal fingers which make electrical contact to the cathodes of the main cells and diverter regions. The floating metal straps 107 for providing an electrically conductive path between the cathodes of the edge cells 102 and the source cells 103 are also shown.

Figure 6A:
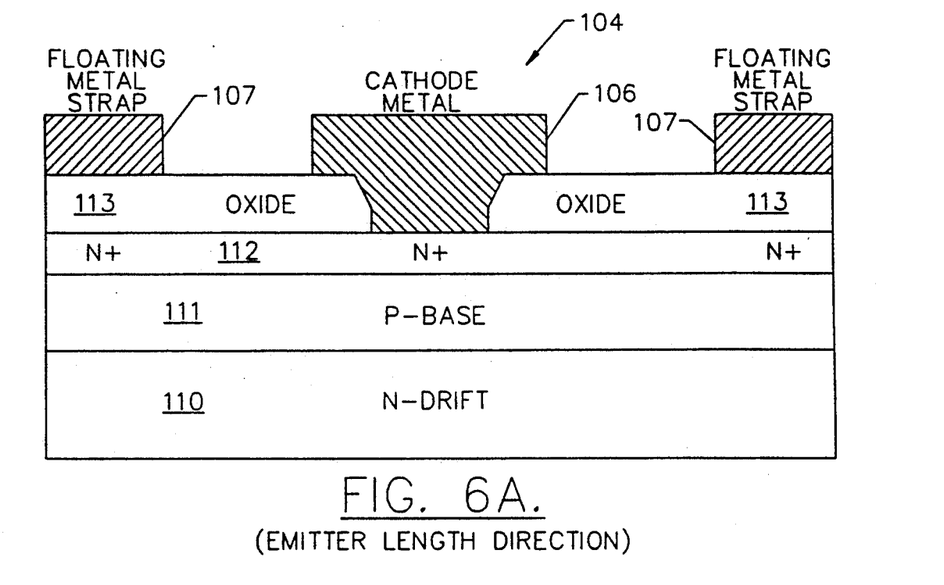
FIG. 6A illustrates a cross-sectional representation of the core cell of FIG. 4, taken in the emitter length direction.
Figure 6B:
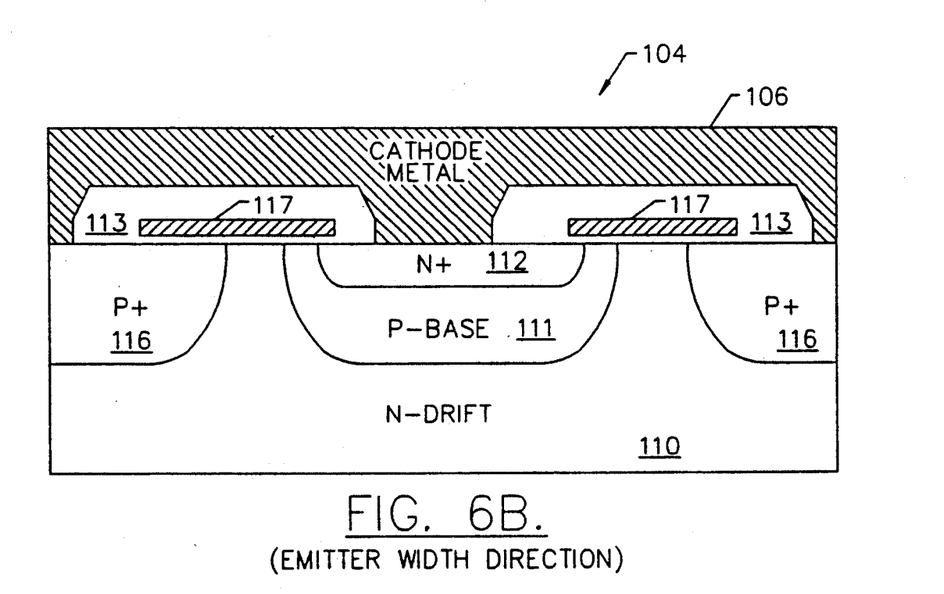
FIG. 6B illustrates a cross-sectional representation of the core cell of FIG. 6A, taken in the emitter width direction.

Referring now to FIGS. 6A and 6B, a description of the preferred core cell 104 will be provided. For purposes of illustration only, the anode contact, anode layer and the N+ portion of the first base region have been eliminated from view since they are configured the same for all cells in the preferred embodiment. Referring now to FIG. 6A, a cross-sectional view of the core cell 104 taken in the emitter length direction is provided and shows the layered orientation of the drift 110, P-base 111, and emitter 112 regions. An oxide layer 113 is provided for isolating the floating metal strap 107 from the substrate. The floating metal strap 107 electrically connects the source cells 103 to the edge cells 102. The cathode contact metal 106 provides the parallel cathode connection for all core and source cells.

Referring now to FIG. 6B, a cross-sectional view of the core cell 104 taken along the emitter width direction is shown. The P+ diverter regions 116 are isolated from the P-base regions 111 by the drift region 110. The regions 117 form the gate electrodes of the field effect transistors which control turn-on and turn-off. During turn-on, the gate electrodes 117 are enabled with a positive voltage to thereby electrically connect the emitter region 112 to the N− drift region 110. During turn-off, the gate electrodes are enabled with a negative voltage to thereby electrically connect the P-base regions 111 to the diverter regions 116.

Figure 7A:
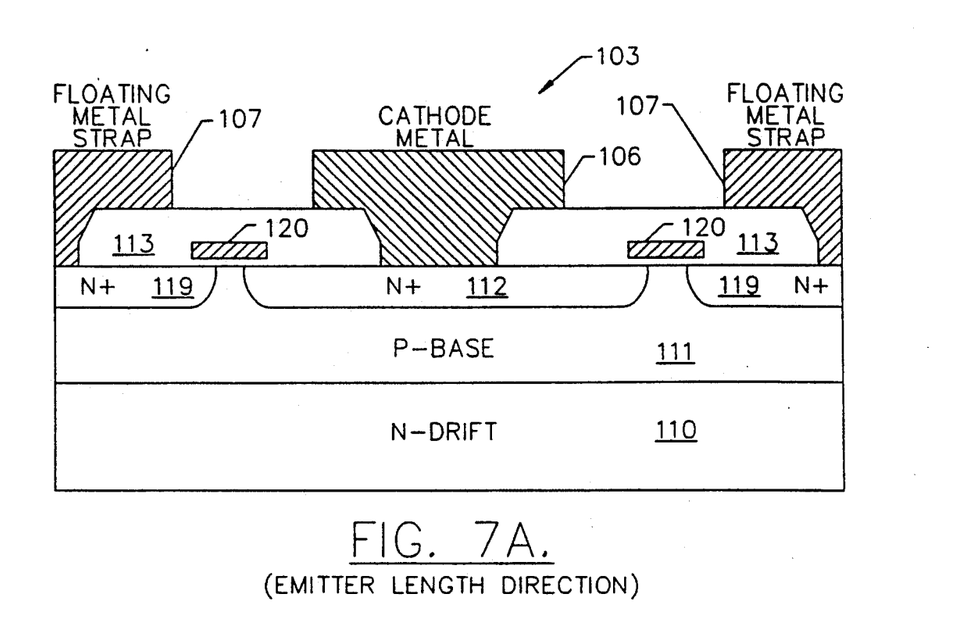
FIG. 7A illustrates a cross-sectional representation of the source cell of FIG. 4, taken in the emitter length direction.
Figure 7B:
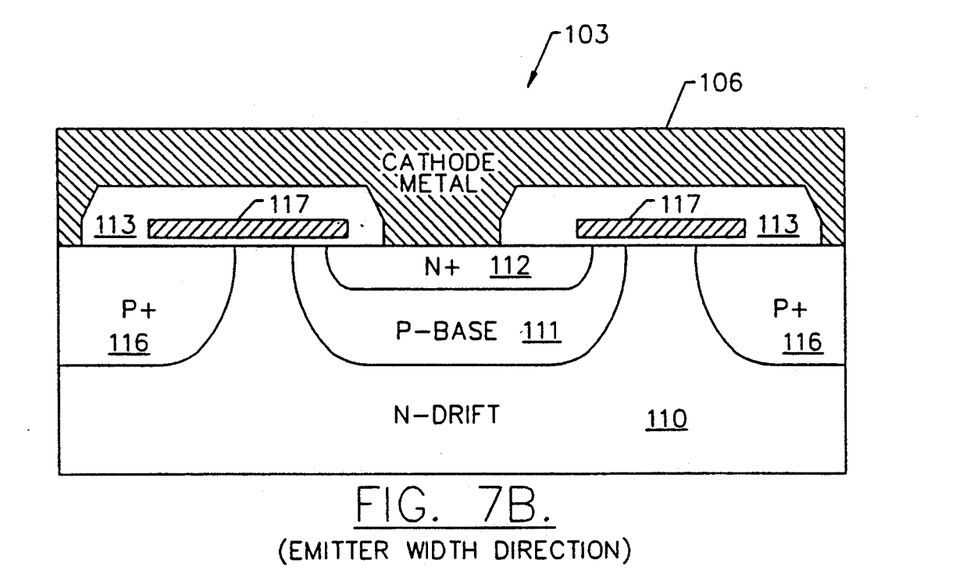
FIG. 7B illustrates a cross-sectional representation of the source cell of FIG. 7A, taken in the emitter width direction.

Referring now to FIGS. 7A and 7B, a description of the preferred source cell 103 will be provided. As shown in FIG. 7A, the collector regions 119 are formed in the P-base region 111 and are electrically connected to the floating metal straps 107. The gate electrodes 120 are provided between the emitter region 112 and collector regions 119 for control of the export current to the edge cells 102. In the emitter width direction, the source cells 103 are configured the same as the core cells 104, as shown in FIG. 7B.

Figure 8A:
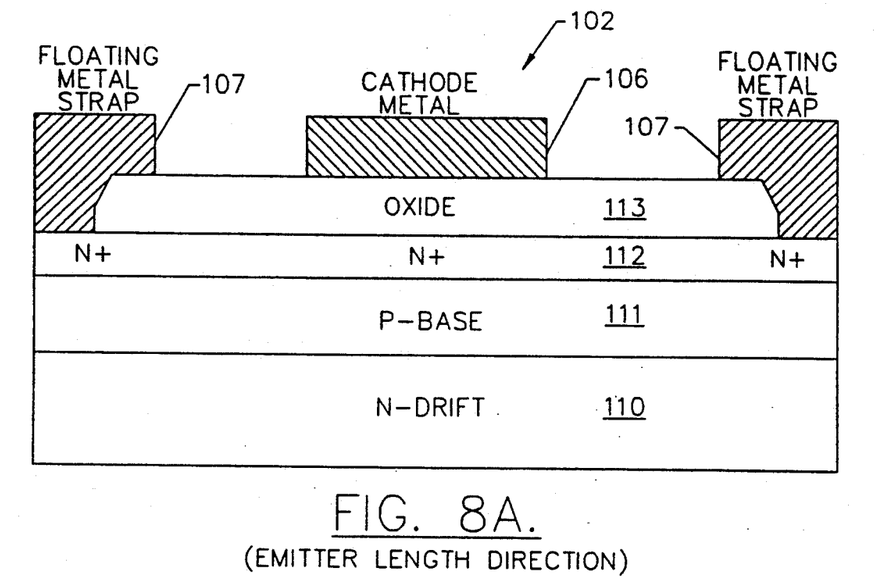
FIG. 8A illustrates a cross-sectional representation of the edge cell of FIG. 4, taken in the emitter length direction.
Figure 8B:
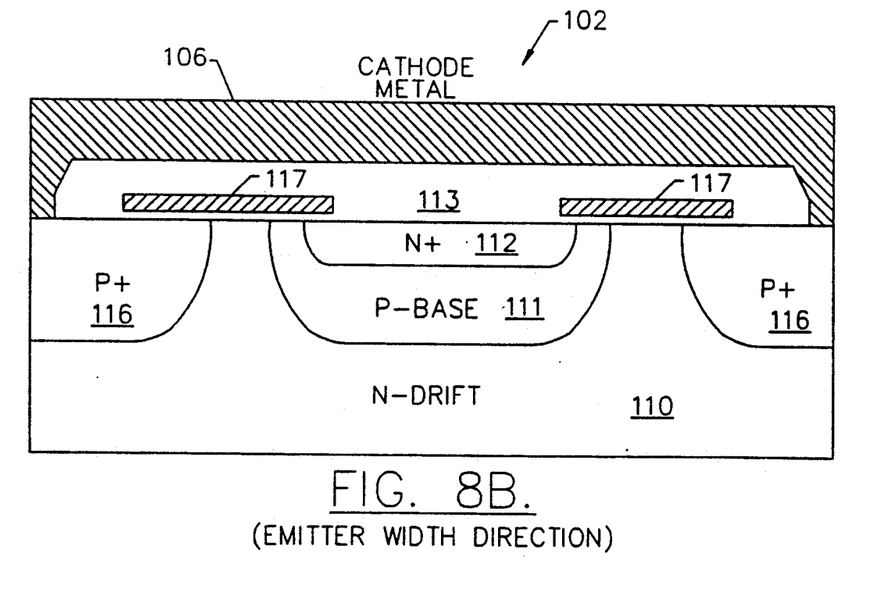
FIG. 8B illustrates a cross-sectional representation of the edge cell of FIG. 8A, taken in the emitter width direction.

Referring now to FIGS. 8A and 8B, a description of the preferred edge cell 102 will be described. Because the edge cells are controlled by current provided by the source cells, there is preferably no electrical connection between the edge cell emitter regions 112 and the cathode contact metal 106, as shown in FIG. 8A. However, the floating metal straps 107 make electrical contact to the edge cell emitter regions 112. As shown in FIG. 8B, the cathode contact metal 106 makes electrical contact with the diverter regions 116 for removing hole current during turn-off.

Accordingly, the integrated multicelled semiconductor switching device of the present invention comprises a plurality of main thyristor cells and a plurality of edge thyristor cells. The main thyristor cells comprise source cells located in the center or innermost portion of the integrated device and the edge cells are located at the periphery. A current exporting means is provided to transfer current from the source cells to the edge cells to thereby limit hole current crowding effects in the peripheral cells. The anodes of all cells are electrically connected and the cathodes of all main cells are electrically connected. However, the cathodes of the edge cells are electrically connected to one or more source cells by the current exporting means. The unit cell of the multicelled device preferably comprises a BRT, but can comprise other well known thyristor structures where the turn-off control is limited by hole-current crowding in the P-base region.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A semiconductor switching device comprising:
   a semiconductor substrate having first and second opposing faces;
   a cathode contact on said first face;
   an anode contact on said second face;
   a first thyristor in said semiconductor substrate for producing a predetermined current, said first thyristor including a first emitter region of first conductivity type at said first face, contacting said cathode contact, and an anode region of second conductivity type at said second face, contacting said anode contact;
   a second thyristor in said semiconductor substrate, said second thyristor being located closer to an edge of said semiconductor substrate than said first thyristor and including a second emitter region which is electrically disconnected from said cathode contact at said first face; and
   current exporting means, electrically connected between said first thyristor and said second thyristor and electrically disconnected from said cathode contact at said first face, for exporting a portion of said predetermined current to said second thyristor;
   wherein said first thyristor is electrically connected in parallel, between said cathode contact and said anode contact, with the series combination of said current exporting means and said second thyristor.

2. The semiconductor switching device of claim 1 further comprising a third thyristor in said semiconductor substrate, electrically connected in parallel with said first thyristor, said switching device further comprising an insulating region for preventing electrical conduction between said electrical connecting means and said third thyristor.

3. A semiconductor switching device comprising:

a semiconductor substrate;

a first thyristor in said semiconductor substrate for producing a predetermined current;

a second thyristor in said semiconductor substrate, said second thyristor being located closer to an edge of said semiconductor than said first thyristor; and current exporting means, electrically connected between said first thyristor and said second thyristor, for exporting a portion of said predetermined current to said second thyristor, wherein said first thyristor comprises an anode, a first base region, a second base region and a first emitter region in said second base region, and wherein said current exporting means comprises a collector region in said second base region adjacent said first emitter region; export gating means, for electrically connecting said collector region to said first emitter region, in response to a first bias signal; and means for electrically connecting said collector region to said second thyristor.

4. The semiconductor switching device of claim 3 wherein said second thyristor comprises a second emitter region in said semiconductor substrate at a position closer to an edge of said semiconductor substrate than said first emitter region, and wherein said electrical connecting means comprises means for electrically connecting said collector region to said second emitter region.

5. The semiconductor switching device of claim 3 wherein said electrical connecting means comprises a floating conductive strap on the surface of said semiconductor substrate, for electrically connecting said collector region to said second emitter region.

6. The semiconductor switching device of claim 3, further comprising a cathode contact on said semiconductor substrate, electrically connected to said first emitter region, and wherein said first thyristor further comprises:

a diverter region in said first base region, electrically connected to said cathode contact;

gating means for electrically connecting said first emitter region to said first base region, in response to a second bias signal; and diverting means for electrically connecting said second base region to said diverter region, in response to a third bias signal.

7. The semiconductor switching device of claim 6, wherein said gating means comprises a second field effect transistor of predetermined conductivity type, having a second gate electrode and an active region in said second base region, for providing an electrical connection between said first emitter region and said first base region, in response to said second bias signal being applied to said second gate electrode.

8. The semiconductor switching device of claim 7, wherein said diverting means comprises a third field effect transistor of opposite conductivity type from said second field effect transistor, having a third gate electrode and an active region in said first base region, for providing an electrical connection between said second base region and said diverter region, in response to said third bias signal being applied to said third gate electrode.

9. The semiconductor switching device of claim 8, wherein said export gating means comprises a first field effect transistor of said predetermined conductivity type, having a first gate electrode and an active region in said second base region, for providing an electrical connection between said collector region and said first emitter region, in response to said first bias signal being applied to said first gate electrode.

10. The semiconductor switching device of claim 9, wherein said first field effect transistor is an N-channel MOSFET, said second field effect transistor is a N-channel MOSFET and said third field effect transistor is an P-channel MOSFET.

11. The semiconductor switching device of claim 10 wherein the gate electrodes of said first, second and third MOSFETs are electrically connected.

12. A semiconductor switching device comprising:

a semiconductor substrate;

a first thyristor in said semiconductor substrate, comprising an anode, a first base region, a second base region and a first emitter region in said second base region and forming a P-N junction therewith;

a collector region in said second base region adjacent said first emitter region;

a cathode contact on said substrate, electrically connected to said first emitter region;

a diverter region in said first base region, electrically connected to said cathode contact;

a first field effect transistor of predetermined conductivity type having an active region in said second base region, between said first emitter region and said first base region;

a second field effect transistor of opposite conductivity type from said first field effect transistor, and having an active region in said first base region, between said second base region and said diverter region;

a third field effect transistor of said predetermined conductivity type having an active region in said second base region, between said collector region and said first emitter region;

a second thyristor in said semiconductor substrate, said second thyristor comprising a second emitter region in said semiconductor substrate at a position closer to an edge of said semiconductor substrate than said first thyristor; and an electrical connector between said collector region and said second emitter region.

13. The semiconductor switching device of claim 12 further comprising an insulating region and a third thyristor in said semiconductor substrate, electrically connected in parallel with said first thyristor and electrically isolated from said electrical connector by said insulating region, said third thyristor located closer to the interior of said semiconductor substrate than said first thyristor.

14. The semiconductor switching device of claim 12, wherein said first field effect transistor is an N-channel MOSFET, said second field effect transistor in a P-channel MOSFET and said third field effect transistor is an N-channel MOSFET.

15. The semiconductor switching device of claim 14 wherein the gate electrodes of said first, second and third MOSFETs are electrically connected.

16. The semiconductor switching device of claim 12 wherein said electrical connector comprises a floating conductive strap on the surface of said semiconductor substrate, extending between said collector region and said second emitter region.

17. A multiple cell semiconductor switching device comprising:
   a semiconductor substrate having first and second opposing faces;
   a cathode contact on said first face;
   an anode contact on said second face;
   a plurality of first thyristor cells in said semiconductor substrate, each for producing a predetermined current, wherein each of said first thyristor cells includes a first emitter region of first conductivity type at said first face, contacting said cathode contact, and includes an anode region of second conductivity type at said second face, contacting said anode contact;
   a plurality of second thyristor cells in said semiconductor substrate, each for producing said predetermined current, said second thyristor cells being located closer to the interior of said semiconductor substrate than said first thyristor cells;
   a plurality of third thyristor cells in said semiconductor substrate, said third thyristor cells being located closer to an edge of said semiconductor substrate than said first thyristor cells and said second thyristor cells, wherein each of said third thyristor cells includes a second emitter region which is electrically disconnected from said cathode contact at said first face; and
   a plurality of current exporting means, each electrically connected between at least one of said first thyristor cells and at least one of said third thyristor cells and electrically disconnected from said cathode contact at said first face, for exporting a portion of said predetermined current from said first thyristor cells to said third thyristor cells, said second thyristor cells electrically connected in parallel with said first thyristor cells, between said cathode contact and said anode contact, and electrically connected in parallel with the series combination of said current exporting means and said third thyristor cells.

18. A multiple cell semiconductor switching device comprising:
   a semiconductor substrate;
   a plurality of first thyristor cells in said semiconductor substrate, each for producing a predetermined current;
   a plurality of second thyristor cells in said semiconductor substrate, each for producing said predetermined current, said second thyristor cells being located closer to the interior of said semiconductor substrate than said first thyristor cells;
   a plurality of third thyristor cells in said semiconductor substrate, said third thyristor cells being located closer to an edge of said semiconductor substrate than said first thyristor cells and said second thyristor cells; and
   a plurality of current exporting means, each electrically connected between at least one of said first thyristor cells and at least one of said third thyristor cells, for exporting a portion of said predetermined current from said first thyristor cells to said third thyristor cells, said second thyristor cells electrically connected in parallel with said first thyristor cells and electrically connected in parallel with the series combination of said current exporting means and said third thyristor cells,
   wherein each of said first thyristor cells comprises an anode, a first base region, a second base region and a first emitter region in said second base region and forming a P-N junction therewith, and
   wherein each of said current exporting means comprises a collector region in said second base region of a respective first thyristor cell, adjacent said respective first emitter region; export gating means, for electrically connecting said collector region to said respective first emitter region, in response to a bias signal; and means for electrically connecting said collector region to at least one of said plurality of third thyristor cells.

19. The multiple cell semiconductor switching device of claim 18 wherein each of said third thyristor cells comprises a second emitter region in said semiconductor substrate, and wherein said respective electrical connecting means comprises means for electrically connecting said respective collector region to at least one of said second emitter regions.

20. The multiple cell semiconductor switching device of claim 18 wherein each of said electrical connecting means comprises a floating conductive strap on the surface of said semiconductor substrate, for electrically connecting at least one of said collector regions to at least one of said third thyristor cells.

21. The multiple cell semiconductor switching device of claim 18, further comprising a cathode contact on said semiconductor substrate, electrically connected to each of said first emitter regions, and wherein each of said first thyristor cells further comprises:
   a diverter region in said first base region, electrically connected to said cathode contact;
   gating means for electrically connecting said respective first emitter region to said first base region, in response to a second bias signal; and
   diverting means for electrically connecting said respective second base region to said respective diverter region, in response to a third bias signal.

22. The multiple cell semiconductor switching device of claim 21, wherein each of said gating means comprises a first fluid effect transistor of predetermined conductivity type having an active region in said second base region, between said respective first emitter region and said first base region.

23. The multiple cell semiconductor switching device of claim 22, wherein each of said diverting means comprises a second field effect transistor having an active region in said first base region between said respective second base region and said respective diverter region.

24. The multiple cell semiconductor switching device of claim 23, wherein each of said export gating means comprises a third field effect transistor of said predetermined conductivity type having an active region in said respective second base region, between said respective collector region and said respective first emitter region.

25. The multiple cell semiconductor switching device of claim 24, wherein each of said first field effect transistors in an N-channel MOSFET, each of said second field effect transistors in a P-channel MOSFET and each of said third field effect transistor is an N-channel MOSFET.

26. The multiple cell semiconductor switching device of claim 26 wherein the gate electrodes of each of said first, second and third MOSFETs are electrically connected.

27. A multiple cell semiconductor switching device comprising:
- a semiconductor substrate;
- a plurality of first thyristor cells in said semiconductor substrate, each comprising an anode, a first base region, a second base region and a first emitter region in said second base region;
- a collector region in each of said second base regions adjacent the associated first emitter region;
- a cathode contact on said semiconductor substrate, electrically connected to each of said first emitter regions;
- a diverter region in each of said first base regions, electrically connected to the cathode contact;
- a plurality of first field effect transistors of predetermined conductivity type, a respective one of which has an active region between a respective first emitter region and a respective first base region of a respective first thyristor cell;
- a plurality of second field effect transistors of opposite conductivity type from said plurality of first field effect transistors, a respective one of which has an active region between a respective second base region and a respective diverter region of a respective first thyristor cell;
- a plurality of third field effect transistors of said predetermined conductivity type, a respective one of which has an active region between a respective collector region and a respective first emitter region of a respective first thyristor cell;
- a plurality of second thyristor cells in said semiconductor substrate, electrically connected in parallel with said plurality of first thyristor cells and located closer to the interior of said semiconductor substrate than said plurality of first thyristor cells;
- a plurality of third thyristor cells in said semiconductor substrate, each of which includes a second emitter region, said third thyristor cells being located closer to an edge of said semiconductor substrate than said first thyristor cells and said second thyristor cells; and
- a plurality of electrical connectors, each of which electrically connects at least one of said collector regions and at least one of said second emitter regions.

28. The multiple cell semiconductor switching device of claim 27, wherein each of said first field effect transistors is an N-channel MOSFET, each of said second field effect transistors is a P-channel MOSFET and each of said third field effect transistors is an N-channel MOSFET.

29. The multiple cell semiconductor switching device of claim 28 wherein the gate electrodes of said first, second and third MOSFETs are electrically connected.

30. The multiple cell semiconductor switching device of claim 27 wherein each of said electrical connectors comprises a floating conductive strap on the surface of said semiconductor substrate, extending between at least one of said collector regions and at least one of said second emitter regions.

* * * * *